(12) United States Patent
Morhard et al.

(10) Patent No.: US 9,469,526 B2
(45) Date of Patent: Oct. 18, 2016

(54) METHOD FOR THE PRODUCTION OF CONICAL NANOSTRUCTURES ON SUBSTRATE SURFACES

(75) Inventors: Christoph Morhard, Stuttgart (DE); Claudia Pacholski, Stuttgart (DE); Joachim P. Spatz, Stuttgart (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 845 days.

(21) Appl. No.: 13/518,594

(22) PCT Filed: Dec. 17, 2010

(86) PCT No.: PCT/EP2010/007750
§ 371 (c)(1),
(2), (4) Date: Jun. 22, 2012

(87) PCT Pub. No.: WO2011/076369
PCT Pub. Date: Jun. 30, 2011

(65) Prior Publication Data
US 2012/0268823 A1    Oct. 25, 2012

(30) Foreign Application Priority Data
Dec. 23, 2009    (DE) .................... 10 2009 060 223

(51) Int. Cl.
*B44C 1/22* (2006.01)
*G02B 1/10* (2015.01)
*B81C 1/00* (2006.01)

(52) U.S. Cl.
CPC .... *B81C 1/00031* (2013.01); *B81B 2203/0361* (2013.01); *B81B 2207/056* (2013.01); *Y10T 428/24479* (2015.01)

(58) Field of Classification Search
None
See application file for complete search history.

(56) References Cited

U.S. PATENT DOCUMENTS

| 6,051,149 A * | 4/2000 | Frendt .......................... 216/42 |
| 6,780,491 B1 * | 8/2004 | Cathey et al. ............... 428/143 |
| 8,361,339 B2 * | 1/2013 | Nakanishi et al. ............ 216/58 |

(Continued)

FOREIGN PATENT DOCUMENTS

| CN | 1930079 A | 3/2007 |
| DE | 19747815 A1 | 5/1999 |
| DE | 102007014538 A1 | 10/2008 |

(Continued)

OTHER PUBLICATIONS

Haupt, et al., "Polymer Masks on Semiconductors: A Novel Way to Nanostructures", phys. stat. sol. (b), vol. 224, No. 3, pp. 867-870 (2001).

(Continued)

*Primary Examiner* — Shamim Ahmed
(74) *Attorney, Agent, or Firm* — Caesar Rivise, PC

(57) ABSTRACT

The invention relates to conical structures on substrate surfaces, in particular optical elements, to methods for the production thereof and to the use thereof, in particular in optical devices, solar cells and sensors. The conical nanostructures according to the invention are suitable in particular for providing substrate surfaces having very low light reflection. The method according to the invention for producing conical nanostructures on substrate surfaces comprises at least the steps of: a) providing a substrate surface covered with nanoparticles; b) etching the substrate surface covered with nanoparticles to a depth of at least 100 nm, wherein the nanoparticles act as an etching mask and the etching parameters are set in such a way that hyperboloid structures are produced underneath the nanoparticles; c) breaking the hyperboloid structures in the region of the smallest diameter by exerting mechanical forces, wherein the structures remaining on the substrate surface have a conical shape which corresponds substantially to half a single-shell hyperboloid.

13 Claims, 4 Drawing Sheets

(56) References Cited

U.S. PATENT DOCUMENTS

| | | | |
|---|---|---|---|
| 2005/0112048 A1 | 5/2005 | Tsakalakos et al. | |
| 2005/0230697 A1 | 10/2005 | Kwon et al. | |
| 2008/0296252 A1* | 12/2008 | D'Urso et al. | 216/11 |
| 2009/0061150 A1* | 3/2009 | Noguchi et al. | 428/119 |
| 2009/0114618 A1* | 5/2009 | Zhang et al. | 216/42 |
| 2009/0231714 A1 | 9/2009 | Zhao et al. | |
| 2010/0112234 A1 | 5/2010 | Spatz et al. | |

FOREIGN PATENT DOCUMENTS

| | | |
|---|---|---|
| DE | 102007017032 A1 | 10/2008 |
| EP | 1027157 B1 | 8/2003 |
| JP | 2005353449 A | 12/2005 |
| JP | 2007199522 A | 8/2007 |
| JP | 2009034630 A | 2/2009 |
| JP | 4336818 B2 | 9/2009 |
| WO | 9921652 A3 | 5/1999 |
| WO | 2008116616 A1 | 10/2008 |
| WO | 2008148462 A1 | 12/2008 |

OTHER PUBLICATIONS

Hsu et al., "Wafer-scale silicon nanopillars and nanocones by Langmuir-Blodgett assembly and etching", Applied Physics Letters, vol. 93, pp. 133109-1-133109-3 (2008).

Kanamori et al., "Broadband antireflection gratings fabricated upon silicon substrates", Optics Letters, vol. 24, No. 20, pp. 1422-1424 (1999).

Lohmueller et al., "Biomimetic Interfaces for High-Performance Optics in the Deep-UV Light Range", Nano Letters, vol. 8, No. 5, pp. 1429-1433 (2008).

Toyota et al., "Fabrication of Microcone Array for Antireflective Structured Surface Using Metal Dotted Pattern", Jpn. J. Appl. Phys., vol. 40, pp. L747-L749 (2001).

International Search Report for PCT/EP2010/007750 dated Aug. 9, 2011.

English language abstract for JP 4336818 B2 (2009).

English language abstract for JP 2007199522 A (2007).

English language abstract for JP 2009034630 A (2009).

Park et al., "Formation of graphite nanocones using metal nanoparticles as plasma etching masks", J. Vac. Sci. Technol. B 22, pp. 1290-1293 (2004).

Sahoo et al., "Silicon Nitride Nanopillars and Nanocones Formed by Nickel Nanoclusters and Inductively Coupled Plasma Etching for Solar Cell Application", Japanese Journal of Applied Physics, vol. 48, No. 12R, 126508 (2009).

Villanueva et al., "Deep reactive ion etching and focused ion beam combination for nanotip fabrication", Materials Science & Engineering C-Biomimetic and Supramolecular Systems (ISSN: 0928-4931), vol. 26, No. 2-3, p. 164-168 (2006).

\* cited by examiner

METHOD FOR THE PRODUCTION OF CONICAL NANOSTRUCTURES ON SUBSTRATE SURFACES

BACKGROUND OF THE INVENTION

A partial reflection of light is always to be observed when light impinges onto a boundary surface, e.g. air/glass or vice versa. In the case of perpendicular incidence onto a sheet of glass, approximately 4% of the incident light is reflected at each of the two boundary surfaces. This value increases to approx. 5% for light incidence at an acute or obtuse angle. This partial reflection constitutes a considerable problem for many applications, for example in optical elements such as lenses, etc. in which as high a transmission as possible is desired.

Anti-reflection coatings which consist of thin films are commercially available. Such coatings are costly, however, the mechanical stability thereof is often unsatisfactory and the tolerance thereof with respect to the angle of incidence is low. Recently, to solve these problems, microstructures and nanostructures, which are similar to the structures of moth eyes and are therefore also termed moth-eye structures by way of illustration, were applied onto the surfaces of optical elements (Kanamori et al. (1999) OPTICS LETTERS 24 (20), 1422-1424; Toyota et al. (2001), Jpn. J. Appl. Phys. 40 (7B), 747-749). Most of these approaches are based on slow and costly application methods, such as e.g. electron beam lithography.

A simple and inexpensive method, using which moth-eye structures can be created directly on quartz glass by means of etching, is described in the German laid-open specification DE 10 2007 014 538 A1 and in the corresponding international publication WO 2008/116616 A1, as well as in Lohmüller et al., NANO LETTERS 2008, Vol. 8, No. 5, 1429-1433. The etching method disclosed therein is, however, not yet optimal to the extent that the moth-eye structures obtainable therewith are generally based on an arrangement of column-like structures. These column-like structures are inferior to the conical microstructures on a natural moth eye with respect to the anti-reflective action thereof. With the method mentioned, as a matter of principle it is barely possible to produce ideal conical structures, as in this process gold particles are used as etching masks and the gold particles are removed substantially more slowly than the quartz glass of the substrate surface. If one changes the parameters of the method described (e.g. additional oxygen in the process gas, smaller argon fraction), in order to achieve a more pronounced isotropic removal, although one obtains partially conical structures, these always have a relatively wide and deformed upper end which impairs the anti-reflective properties.

In Applied Physics Letters 93, 133109 (2008), Ching-Mei Hsu et al. describe a method for creating column and cone structures by means of the selective etching of a silicon substrate surface, previously applied $SiO_2$ nanoparticles serving as etching mask. This method, however, does not enable the manufacture of column and cone structures which themselves consist of $SiO_2$ or quartz glass.

It was therefore an object of the present invention to provide various substrate surfaces, including $SiO_2$ surfaces and quartz-glass surfaces, particularly of optical elements, which have an anti-reflective arrangement of approximately ideal conical nanostructures, in a manner which is as simple, material-saving and cost-effective as possible.

This object is achieved according to the method, the substrate surface and the optical element according to the invention.

DESCRIPTION OF THE INVENTION

The method according to the invention for creating conical nanostructures on a substrate surface comprises at least the following steps:
a) providing a substrate surface covered with nanoparticles;
b) etching the substrate surface covered with nanoparticles to a depth of at least 100 nm, wherein the nanoparticles act as etching mask and the etching parameters are set in such a manner that hyperboloid structures arise below the nanoparticles,
c) breaking the hyperboloid structures in the region of the smallest diameter by exerting mechanical forces, wherein the structures remaining on the substrate surface have a conical shape, which essentially corresponds to half of a hyperboloid of one sheet.

The term "hyperboloid" as used above and in the following text particularly means a "hyperboloid of revolution".

Preferably, the method according to the invention comprises a plurality of treatments in etching step b) with the same etchant and/or with various etchants. Particularly preferably, two different etchants are used alternately. The etchant can basically be any etchant known in the prior art and suitable for the respective substrate surface. Preferably, the etchant is selected from the group of chlorine gases, e.g. $Cl_2$, $BCl_3$ and other gaseous chlorine compounds, fluorinated hydrocarbons, e.g. $CHF_3$, $CH_2F_2$, $CH_3F$, fluorocarbons, e.g. $CF_4$, $C_2F_8$, oxygen, argon, $SF_6$ and mixtures thereof. In a particularly preferred embodiment, $SF_6$ is used in at least one treatment step as etchant or as etchant component.

The duration of the entire etching treatment typically lies in the range of 1 minute to 30 minutes, preferably 5 to 15 minutes.

Typically in step b), a plasma etching method ("reactive ion etching") as described in DE 10 2007 014 538 A1 and Lohmüller et al. (NANO LETTERS 2008, Vol. 8, No. 5, 1429-1433) is used and preferably a mixture of argon with at least one other process gas, e.g. $CHF_3$ or $SF_6$, is used. In contrast with the prior art, in the method according to the invention it is not the direct creation of column-like pyramidal or conical nanostructures for which one strives, but rather the formation of hyperboloid structures. This is achieved by corresponding setting of the etching parameters. A large etching depth of at least 100 nm, preferably at least 200 nm or at least 300 nm, particularly preferably at least 400 nm is important. Instead of the one step etching process using an argon/$CF_4$ plasma described by Lohmüller et al., according to the invention preferably a plurality of generally relatively short treatment steps with preferably at least two different etchants are carried out. The individual treatment steps in this case typically have a duration of 10 seconds to 2 minutes, preferably 20 to 60 seconds and can be repeated 2-20 times, preferably 5-10 times or more often. The duration of the entire etching treatment typically lies in the range of 1 minute to 30 minutes, preferably 5 to 15 minutes.

Particularly good results are achieved if $SF_6$ is used as etchant or etchant component in at least one treatment step. Particularly in the case of $SiO_2$ as substrate surface, substantially higher etching rates are realized than with $CF_4$.

The hyperboloid structures obtained typically have a diameter in the range of 5 nm to 50 nm, preferably of 10 nm to 30 nm in the region of the smallest diameter. This region of smallest diameter forms a mechanical weak point of the structure obtained and can be used for a targeted break at this point by means of the exertion of mechanical forces. The structures remaining on the substrate surface following the break have a conical shape which essentially corresponds to half of a hyperboloid of one sheet, more precisely of a hyperboloid of revolution of one sheet, and has approximately half of the height of the original hyperboloid structure. The height of the conical structures typically lies in a range of 50 nm to 400 nm, preferably of 150 nm to 300 nm. The sides preferably enclose an angle between 3° and 35° with the normal.

The exertion of mechanical forces in step c) of the method according to the invention can for example take place by means of an ultrasound treatment, action of vibrations, pneumatic forces or by means of friction. Ultrasound treatment is particularly preferred as in this manner the desired conical structures can be created particularly quickly, simply and efficiently. Suitable non-limiting conditions for such an ultrasound treatment are described in the following exemplary embodiment. Variations of the method conditions may, however, be necessary for optimization depending on the specific substrate used and can be determined easily by the person skilled in the art by means of routine experiments.

The substrate surface is fundamentally not particularly limited and can comprise any material as long as it is accessible for the etching step of the method according to the invention and does not impair or disturb the preceding or following steps. The substrate can for example be selected from glass, silicon, semiconductors, metals, polymers, etc. Transparent substrates are preferred for optical applications in particular. Particularly preferably, the material of the substrate surface is selected from the group made up of quartz glass, $SiO_2$, Si, $Al_2O_3$, $CaF_2$, GaAs.

For some applications it is preferred that the nanoparticles used as etching mask have a predetermined two-dimensional geometric arrangement on the substrate surface. Such arrangement has predetermined minimum or average particle spacings as a characteristic, wherein these predetermined particle spacings can be the same in all regions of the substrate surface or various regions can have different predetermined particle spacings. A geometric arrangement of this type can fundamentally be realized with any suitable method of the prior art, micellar nanolithography in particular, as explained in more detail in the following.

According to the invention, it is preferred, but not absolutely necessary that the covering of the substrate surface takes place with nanoparticles with the aid of a micellar diblock copolymer nanolithography technology, as described e.g. in EP 1 027 157 B1 and DE 197 47 815 A1. In micellar nanolithography, a micellar solution of a block copolymer is deposited onto a substrate, e.g. by means of dip coating, and under suitable conditions forms an ordered film structure of chemically different polymer domains on the surface, which inter alia depends on the type, molecular weight and concentration of the block copolymer. The micelles in the solution can be loaded with inorganic salts which, following deposition with the polymer film, can be oxidized or reduced to inorganic nanoparticles. A further development of this technology, described in the patent application DE 10 2007 017 032 A1, enables to two-dimensionally set both the lateral separation length of the polymer domains mentioned and thus also of the resulting nanoparticles and the size of these nanoparticles by means of various measures so precisely that nanostructured surfaces with desired spacing and/or size gradients can be manufactured. Typically, nanoparticle arrangements manufactured with such a micellar nanolithography technology have a quasi-hexagonal pattern.

Fundamentally, the material of the nanoparticles is not particularly limited and can comprise any material known in the prior art for such nanoparticles. Typically, this is a metal or metal oxide. A broad spectrum of suitable materials is mentioned in DE 10 2007 014 538 A1. Preferably, the material of the metal or the metal component of the nanoparticles is selected from the group made up of Au, Pt, Pd, Ag, In, Fe, Zr, Al, Co, Ni, Ga, Sn, Zn, Ti, Si and Ge, mixtures and composites thereof. Specific examples for a preferred metal oxide are titanium oxide, iron oxide and cobalt oxide. Preferred examples for a metal are gold, palladium and platinum and gold is particularly preferred.

The term "particle" as used here also comprises a "cluster", particularly as described and defined in DE 10 2007 014 538 A1 and DE 197 47 815 A1 and both terms can be used here interchangeably.

In the exemplary embodiment, suitable conditions for manufacturing conical nanostructures on a quartz glass surface are described in more detail. It will be evident for the person skilled in the art, however, that variations of these conditions in dependence of the specific materials used may be required and can be determined without difficulty by means of routine experiments.

The products of the method according to the invention offer a wide range of application options in the fields of semiconductor technology, optics, sensor technology and photovoltaics.

A few non-limiting examples for this are the use in optical devices, particularly optical elements such as lenses, diffraction gratings and other refracting or diffractive structures, sensors, particularly CCD sensors and solar cells.

A particularly preferred application relates to the use in optical elements, particularly for minimizing reflection.

Figure 1:
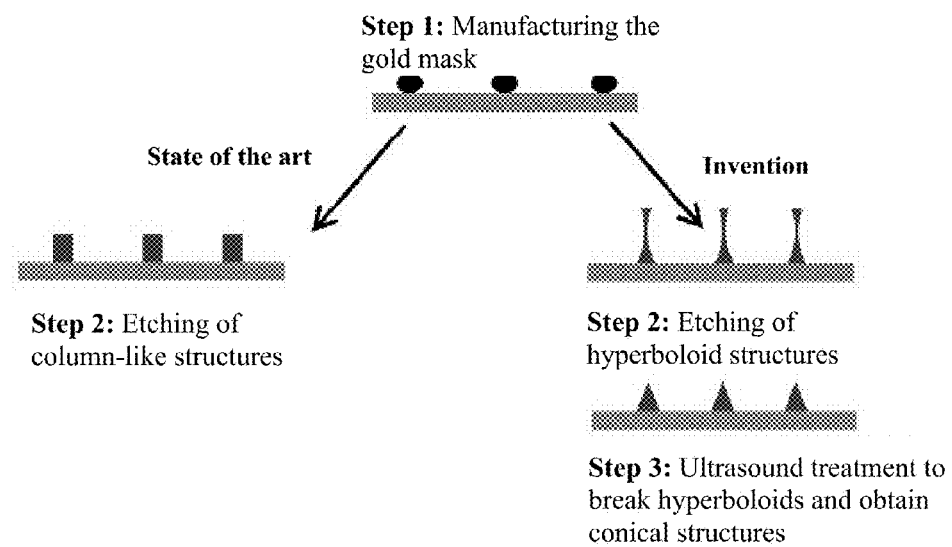
FIG. 1 schematically shows the main steps of the method according to the invention compared to the prior art.

The following examples are used for more in depth explanation of the present invention, without limiting this thereto, however.

EXAMPLE 1

Creation of Conical Nanostructures on a Substrate with an Arrangement of Gold Nanoparticles 1. Providing the Substrate Surface Initially, a substrate surface, e.g. quartz glass was coated with gold nanoparticles in a defined arrangement by means of micellar nanolithography. In this step, one of the protocols described in EP 1 027 157 B1, DE 197 47 815 A1 or DE 10 2007 017 032 A1 can be followed. The method contains the deposition of a micellar solution of a block copolymer (e.g. polystyrene(n)-b-poly(2-vinylpyridine(m))) in toluene) onto the substrate, e.g. by means of dip coating, as a result of which an ordered film structure of polymer domains is formed on the surface. The micelles in the solution are loaded with a gold salt, preferably $HAuCl_4$, which, following deposition with the polymer film, is reduced to the gold nanoparticles. The reduction can take place chemically, e.g. with hydrazine, or by means of energy-rich radiation, such as electron radiation or light. Preferably, after or at the same time as the reduction, the polymer film is removed (e.g. by means of plasma etching with Ar-, H- or O-ions). Thereafter, the substrate surface is covered with an arrangement of gold nanoparticles.

Subsequently, the etching of the substrate surface (quartz glass) covered with gold nanoparticles took place to a depth of at least 100 nm. A "reactive ion etcher" from Oxford Plasma, device: PlasmaLab 80 plus was used to this end. Other devices known in the prior art are likewise fundamentally suitable, however. The etching consisted of two treatment steps with various etchants which were carried out several times one after the other.

Step 1:
A mixture of $Ar/SF_6/O_2$ in the ratio 10:40:8 (sccm) was used as etchant (process gas).
Pressure: 50 mTorr
RF power: 120 W
Time: 60 s
Step 2:
Etchant: $Ar/CHF_3$:10:40
Pressure: 50 mTorr
RF power: 120 W
ICP power: 20 W
Time: 20 s These 2 steps were carried out alternately 8 times.

Then a ten-minute ultrasound treatment took place in water and/or an alcohol (e.g. ethanol). In the actual case, a Bandelin Sonorex model RK 57 was used as ultrasound device. Other ultrasound devices known in the prior art are likewise fundamentally suitable, however. For acoustic irradiation, the sample was introduced standing upright into a glass beaker with the aid of a Teflon holder. Thereafter, the glass beaker was filled with ethanol and/or water until the substrate sample was completely covered. Subsequently, the glass beaker was placed into the ultrasound device and typically acoustically irradiated at a medium energy level for 10 minutes. If necessary, the duration or energy of the acoustic irradiation can be varied. Post treatments are basically not necessary, but a thorough rinsing to remove any broken pieces which are still present may be advantageous.

EXAMPLE 2

Characterization of Nanostructures

Images were taken at various angles of inclination of nanostructures obtained according to the invention and nanostructures of the prior art with the scanning electron microscope.

Figure 2A:
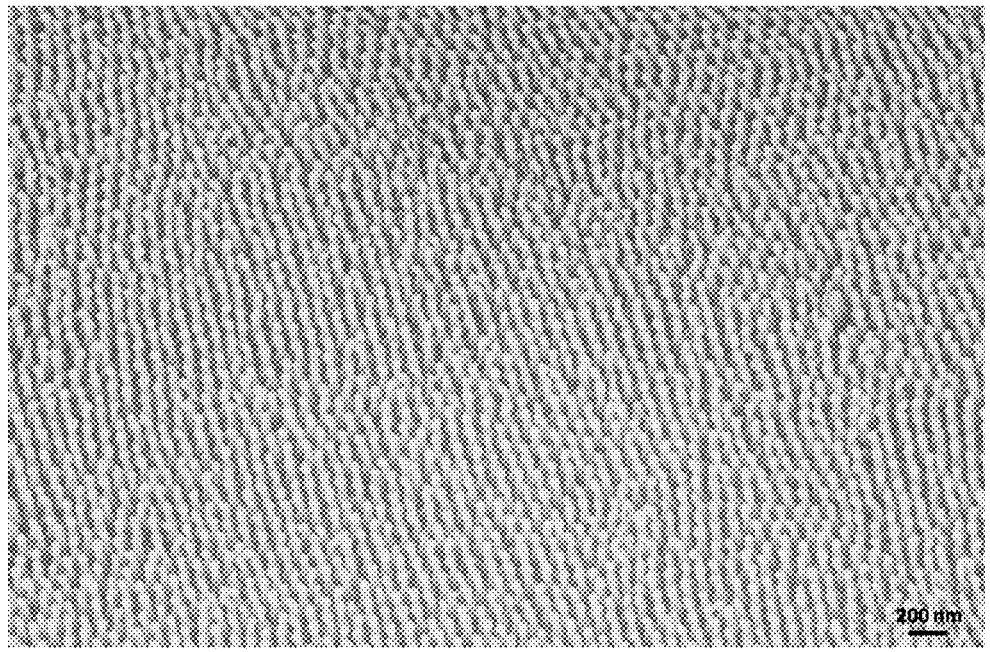
FIG. 2 shows scanning electron microscope images of etched column-like nanostructures which were manufactured with a method of the prior art.
Figure 2B:
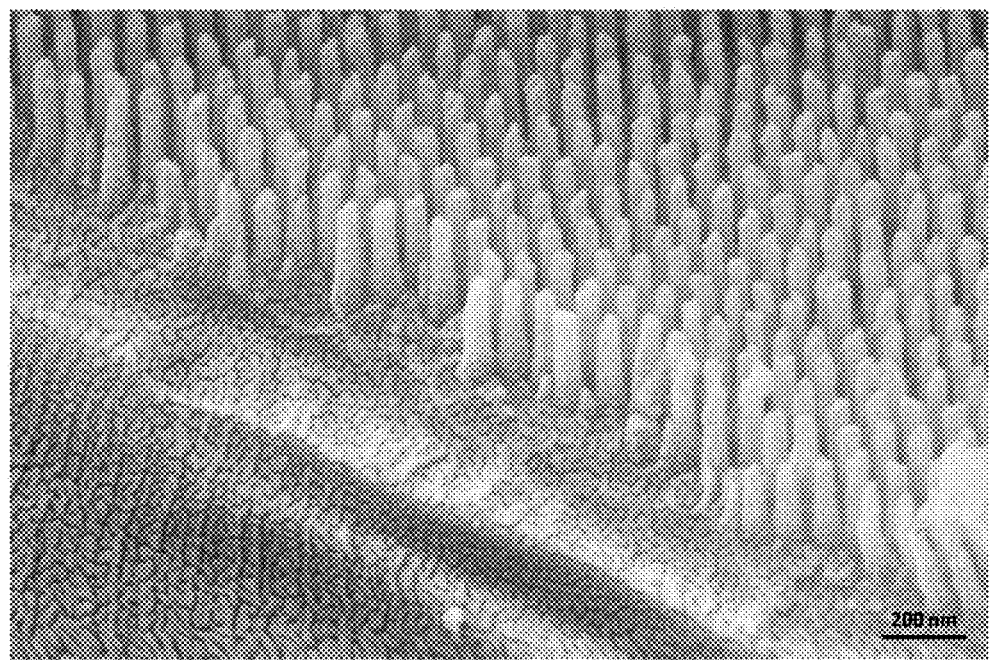

FIG. 2a shows a scanning electron microscope image at an angle of inclination of 20° of etched column-like nanostructures which had been manufactured with a method similar to that described in DE 2007 014 538. The method was changed somewhat (different etching chemistry, a plurality of etching steps) in order to be able to achieve deeper structures. With the specifically mentioned etching conditions of the old method, no structures deeper than 120 nm can be manufactured. The columns have a height of approximately 250 nm and a diameter of approximately 50 nm. The average spacing thereof is approximately 80 nm. FIG. 2b shows an enlarged side view of the same structures at an angle of 45°. Previously, a scratch had been made in the surface by means of a diamond pencil, in order to make it possible to view the shape.

Figure 3:
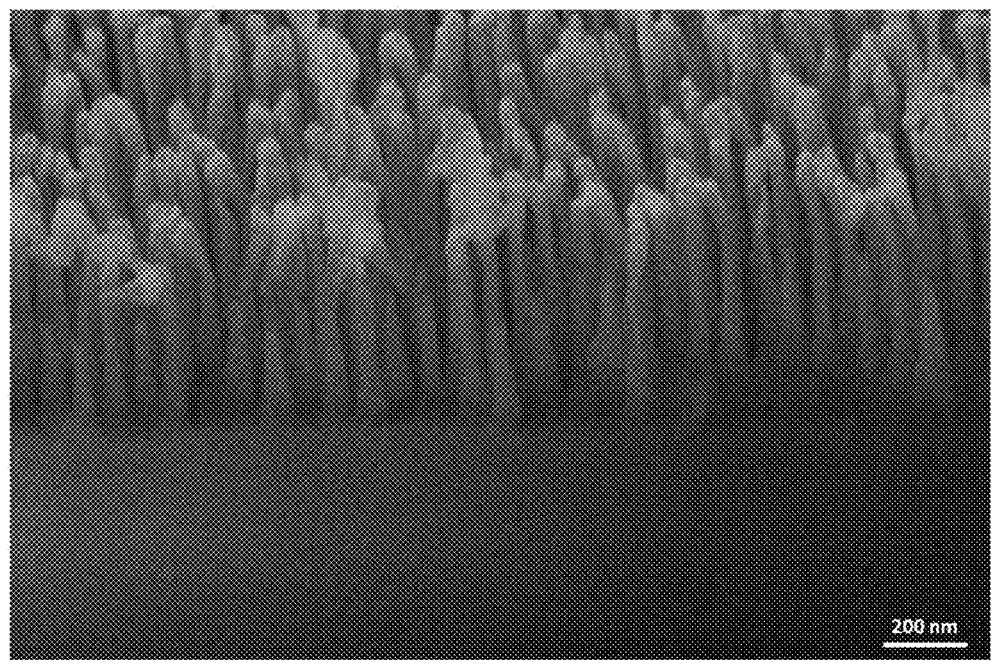
FIG. 3 shows a scanning electron microscope image of etched hyperboloid structures which were manufactured with the method according to the invention.

FIG. 3 shows a scanning electron microscope image of etched hyperboloid structures which were manufactured with the method according to the invention at an angle of inclination of 45°. Height of the structures is approximately 500 nm. The narrowed portion (mechanical weak point) approximately half way up can clearly be seen.

Figure 4A:
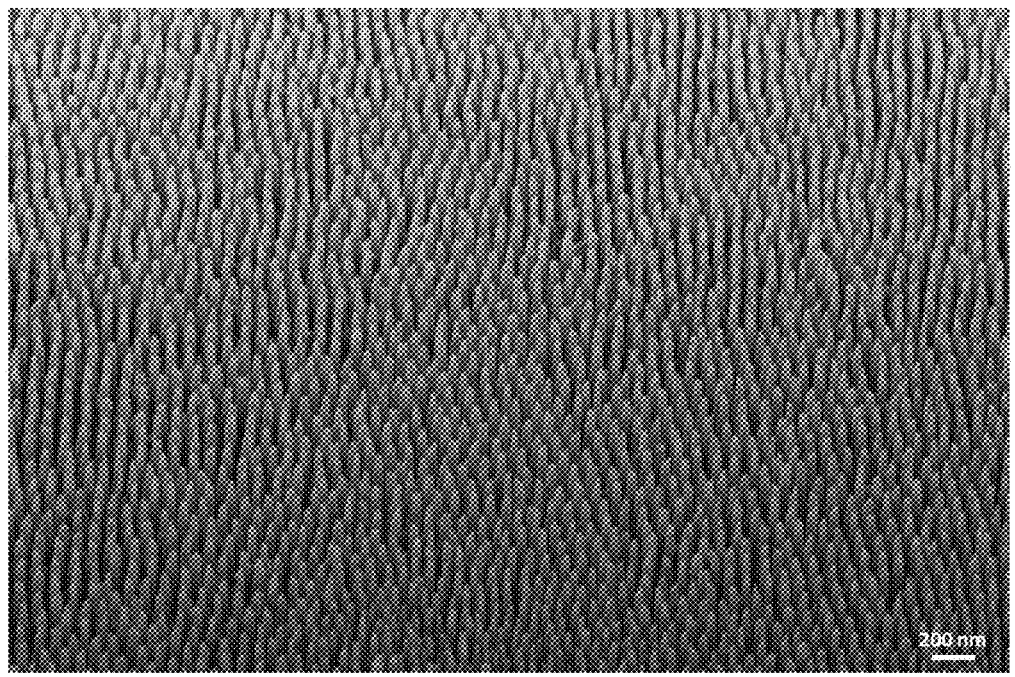
FIG. 4 shows scanning electron microscope images of etched conical nanostructures which were manufactured with the method according to the invention.
Figure 4B:
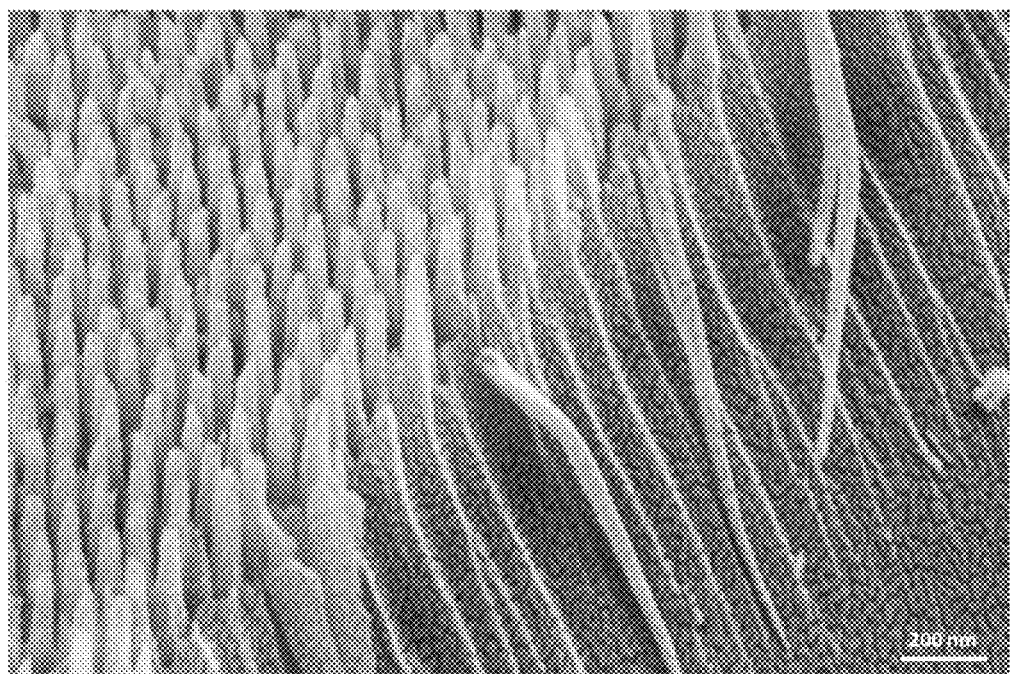

FIG. 4 shows scanning electron microscope images of etched conical nanostructures which were manufactured with the method according to the invention at an angle of inclination of 45° and at two different magnifications. The structures have a height of approximately 250 nm and a diameter at the tip of approximately 35 nm and at the base of approximately 60 nm. This results in a side wall angle of approximately 5.5°. The average spacing thereof is approximately 80 nm.

Transmission measurements were carried out to assess the anti-reflection action of the structures.

Figure 5:
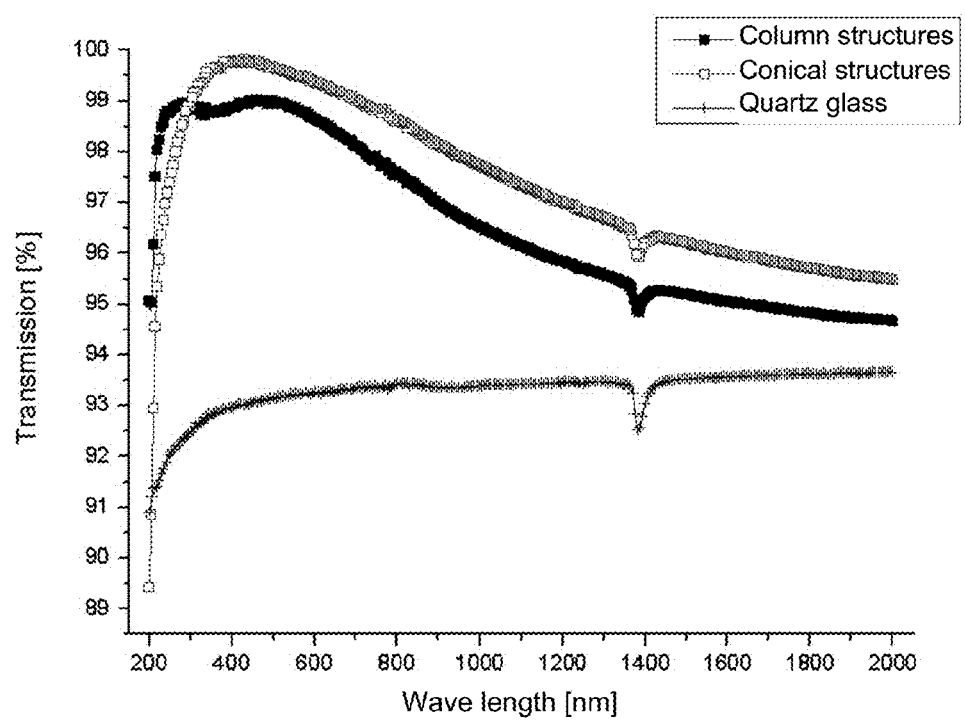
FIG. 5 shows transmission measurements which prove the better performance of quartz glass surfaces with the conical structures obtained according to the invention compared to massive column-like structures and uncoated surfaces.

FIG. 5 shows transmission measurements which prove the better performance of quartz glass surfaces with the conical structures obtained according to the invention compared to massive column-like structures and uncoated surfaces. The curve with the conical structures is substantially more broadbanded, does not show any "interference phenomena" in its course and shows a higher absolute transmission. The measurement of all samples took place in the same spectrometer with the same light sources.

The invention claimed is:

1. A method for creating conical nanostructures on a substrate surface, comprising:
   a) providing the substrate surface covered with nanoparticles;
   b) etching the substrate surface covered with nanoparticles to a depth of at least 100 nm, wherein the nanoparticles act as etching mask and the etching parameters are set in such a manner that hyperboloid structures arise below the nanoparticles, wherein each of the hyperboloid structures has a shape of a hyperboloid of revolution of one sheet with a region of a smallest diameter approximately halfway up the hyperboloid structures from the substrate surface; and
   c) breaking the hyperboloid structures in the region of the smallest diameter by exerting mechanical forces, wherein the structures remaining on the substrate surface have a conical shape which essentially corresponds to half of the hyperboloid of revolution of one sheet.

2. The method according to claim 1, wherein the exertion of mechanical forces in step c) takes place by way of an ultrasound treatment, action of vibrations, pneumatic forces or by way of friction.

3. The method according to claim 1, wherein the etching comprises a treatment with an etchant which is selected from the group consisting of chlorine, gaseous chlorine compounds, fluorinated hydrocarbons, fluorocarbons, oxygen, argon, $SF_6$ and mixtures thereof.

4. The method according to claim 1, wherein the etching comprises a plurality of treatments with one etchant or a plurality of different etchants.

5. The method according to claim 4, wherein the etching comprises at least one treatment with a mixture of $Ar/SF_6/O_2$ as the etchant and at least one treatment with a mixture of $Ar/CHF_3$ as the etchant.

6. The method according to claim 1, wherein the etching is carried out for a period in a range of 1 min to 30 min.

7. The method according to claim 1, wherein the nanoparticles have a predetermined two-dimensional geometric arrangement.

8. The method according to claim 1, wherein the substrate surface comprises a material selected from the group consisting of quartz glass, $SiO_2$, Si, $Al_2O_3$, $CaF_2$, and GaAs.

9. The method according to claim 1, wherein the nanoparticles comprise at least one metal or at least one metal oxide.

10. The method according to claim 9, wherein the at least one metal and a metal component of the at least one metal oxide is a member selected from the group consisting of Au, Pt, Pd, Ag, In, Fe, Zr, Al, Co, Ni, Ga, Sn, Zn, Ti, Si and Ge, mixtures and composites thereof.

11. The method according to claim 10, wherein the nanoparticles are gold nanoparticles.

12. The method according to claim 1, wherein the nanoparticles are applied to the substrate surface by micellar nanolithography.

13. The method according claim 1, wherein the substrate surface is a surface of an optical element and the conical nanostructures created form an anti-reflection surface structure on the optical element.

\* \* \* \* \*